US008118178B2

(12) United States Patent
Olesiewicz et al.

(10) Patent No.: US 8,118,178 B2
(45) Date of Patent: Feb. 21, 2012

(54) RATCHETING RACK-MOUNT KIT REINFORCEMENT MECHANISM FOR STORAGE RACK

(75) Inventors: Timothy W. Olesiewicz, Santa Clara, CA (US); Brett C. Ong, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 147 days.

(21) Appl. No.: 12/609,977

(22) Filed: Oct. 30, 2009

(65) Prior Publication Data

US 2011/0101833 A1    May 5, 2011

(51) Int. Cl.
*A47F 7/00* (2006.01)
(52) U.S. Cl. ........................... 211/26; 312/334.5
(58) Field of Classification Search .................. 248/903, 248/354.7, 292.12, 292.13, 298.1, 244; 211/26, 211/191, 192, 183, 187, 103; 361/724, 727; 182/205, 204
See application file for complete search history.

(56) References Cited

U.S. PATENT DOCUMENTS

| | | | | |
|---|---|---|---|---|
| 971,997 | A * | 10/1910 | Henning | 182/205 |
| 987,960 | A * | 3/1911 | Connors | 182/205 |
| 1,419,748 | A * | 6/1922 | Miller | 182/204 |
| 1,887,495 | A * | 11/1932 | Carter, Jr. | 182/205 |
| 3,016,103 | A * | 1/1962 | Studer | 182/126 |
| 3,874,244 | A * | 4/1975 | Rasmussen et al. | 74/30 |
| 4,147,231 | A * | 4/1979 | Chantler et al. | 182/172 |
| 5,100,092 | A * | 3/1992 | Sovis | 248/429 |
| 5,275,437 | A * | 1/1994 | Modinger et al. | 280/806 |
| 5,678,656 | A * | 10/1997 | Lanzafame | 182/205 |
| 6,181,549 | B1 * | 1/2001 | Mills et al. | 361/679.59 |
| 6,401,866 | B1 * | 6/2002 | Roy | 182/204 |
| 6,450,600 | B1 * | 9/2002 | Chen et al. | 312/334.46 |
| 6,462,670 | B1 * | 10/2002 | Bolognia et al. | 340/815.45 |
| 6,585,336 | B2 * | 7/2003 | Munday et al. | 312/334.4 |
| 6,622,873 | B2 * | 9/2003 | Hegrenes et al. | 211/26 |
| 6,644,480 | B2 * | 11/2003 | Kaminski | 211/26 |
| 6,666,340 | B2 * | 12/2003 | Basinger et al. | 211/26 |
| 6,681,942 | B2 * | 1/2004 | Haney | 211/183 |
| 6,871,897 | B1 * | 3/2005 | Snyder | 296/26.13 |
| 6,962,397 | B2 * | 11/2005 | Dobler et al. | 312/333 |
| 6,997,611 | B2 * | 2/2006 | Chen et al. | 384/21 |
| 7,090,281 | B2 * | 8/2006 | Davey et al. | 296/97.11 |
| 7,137,512 | B2 * | 11/2006 | Nguyen et al. | 211/26 |
| 7,210,198 | B2 * | 5/2007 | Hoshide et al. | 16/96 R |
| 7,255,409 | B2 * | 8/2007 | Hu et al. | 312/334.4 |

(Continued)

*Primary Examiner* — Darnell Jayne
*Assistant Examiner* — Hiwot Tefera
(74) *Attorney, Agent, or Firm* — Marsh Fischmann & Breyfogle LLP; Kent A. Lembke; Jonathan A. Szumny

(57) ABSTRACT

A storage rack for supporting a server chassis in a storage cabinet. The storage rack includes front and rear vertical support members and one or more rack mount kits for slidably supporting one or more computing devices (e.g., servers). Each rack mount kit may include a pair of rail assemblies, each rail assembly including outer, middle and inner rail assemblies. The outer rail assembly may include first and second outer rail members that are slidable relative to each other and one or more locking mechanisms that may be operable to selectively limit sliding or translation of the first and second outer rail members relative to each other. In one arrangement, a locking mechanism may include a ratchet assembly that may allow the first and second outer rail members to slide in a first direction when the locking mechanism is engaged and in the first direction and an opposite second direction when the locking mechanism is released.

20 Claims, 5 Drawing Sheets

U.S. PATENT DOCUMENTS

| | | | |
|---|---|---|---|
| 7,357,468 B2 * | 4/2008 | Hwang et al. | 312/333 |
| 7,399,041 B2 * | 7/2008 | Prentner et al. | 312/333 |
| 7,404,611 B1 * | 7/2008 | Que | 312/334.46 |
| 7,431,410 B2 * | 10/2008 | Sato et al. | 312/333 |
| 7,549,712 B2 * | 6/2009 | Booker et al. | 312/334.6 |
| 7,699,415 B2 * | 4/2010 | Tseng et al. | 312/333 |
| 7,798,339 B2 * | 9/2010 | Brooks et al. | 211/103 |
| 2001/0040142 A1 * | 11/2001 | Haney | 211/183 |
| 2002/0084143 A1 * | 7/2002 | Roy | 182/204 |
| 2003/0141264 A1 * | 7/2003 | Kaminski | 211/26 |
| 2003/0189395 A1 * | 10/2003 | Doornbos et al. | 312/334.1 |
| 2004/0080246 A1 * | 4/2004 | Michaels | 312/334.5 |
| 2005/0017613 A1 * | 1/2005 | Cirocco et al. | 312/333 |
| 2005/0162052 A1 * | 7/2005 | Chen et al. | 312/334.5 |
| 2005/0218759 A1 * | 10/2005 | Kobayashi et al. | 312/331 |
| 2005/0225114 A1 * | 10/2005 | Davey et al. | 296/97.11 |
| 2008/0073469 A1 * | 3/2008 | Mushan et al. | 248/205.1 |
| 2008/0087788 A1 * | 4/2008 | Cheng et al. | 248/404 |
| 2008/0164795 A1 * | 7/2008 | Peng et al. | 312/334.5 |
| 2011/0037362 A1 * | 2/2011 | Park et al. | 312/319.1 |

* cited by examiner

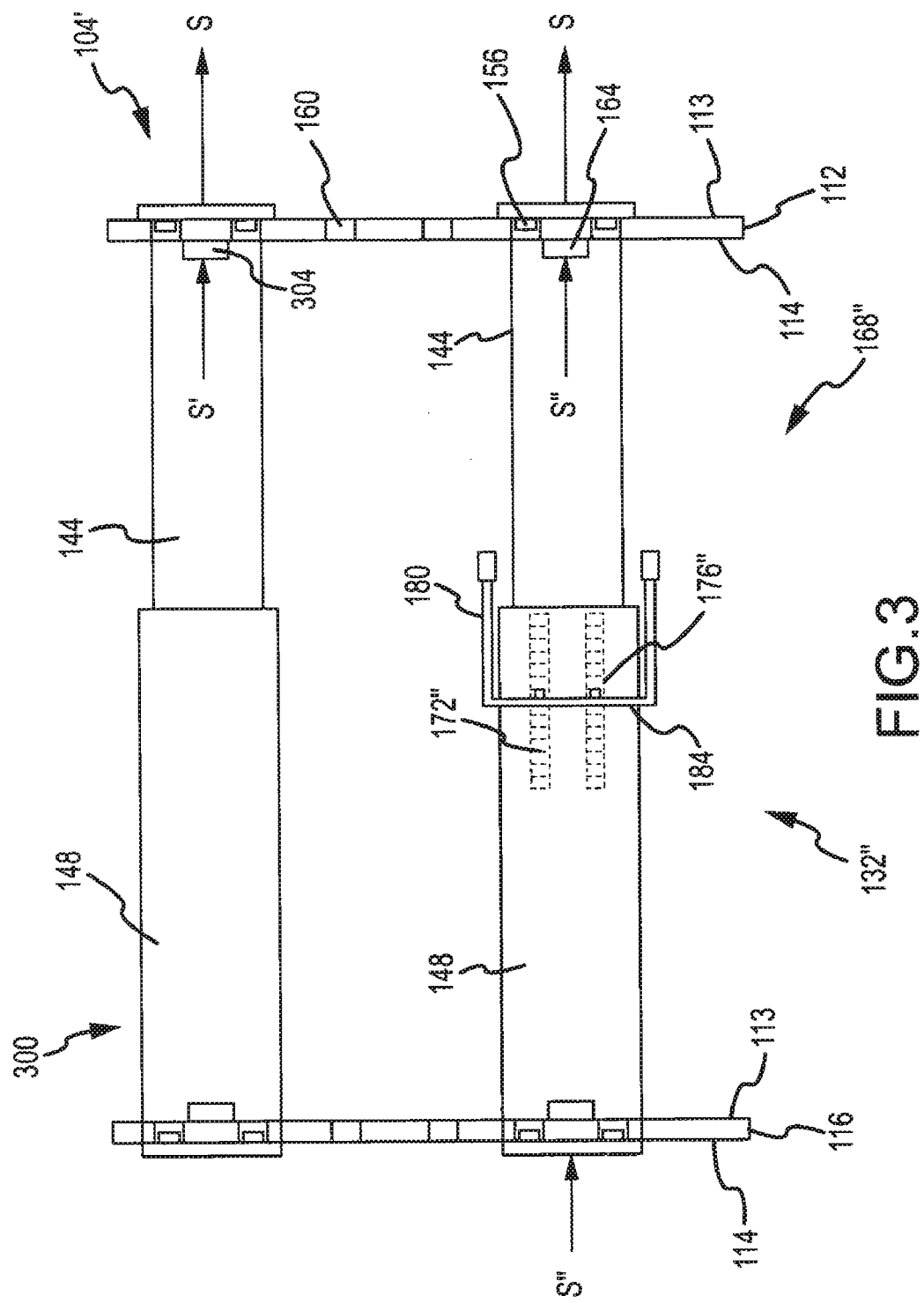

RATCHETING RACK-MOUNT KIT REINFORCEMENT MECHANISM FOR STORAGE RACK

BACKGROUND

1. Field of the Invention

The present invention generally relates to storage racks (e.g., cabinets) for computing devices such as servers, and more particularly to a rail assembly for a storage rack that can be selectively adjusted to accommodate storage racks of varying sizes and then locked to control relative movement between first and second telescoping members of the rail assembly.

2. Relevant Background

Servers and other computer devices are often stored in cabinets or racks. Each of these cabinets or racks may contain numerous servers in a stacked or side-by-side arrangement. For example, a server cabinet may house 5 to 10 servers behind each door. It is desirable for each server to be installed and/or serviced without affecting operation of the other servers, and, in many cases, it is desirable for each server to be maintained or accessed without disconnecting it from power or communications/network links (e.g., to provide hot swappable and maintainable servers in an enterprise or data center environment).

To this end, each server is typically mounted within the cabinet or storage rack using a rail, slide or rack-mount kit. A rail kit typically includes a pair of outer rail assemblies, each of which is attached to vertical support members (e.g., Radio Electronics Television Manufacturers Association ("RETMA") rails) of the storage rack frame and extends horizontally to define a server mounting location within the storage rack or cabinet. Each outer rail assembly is mated with or otherwise interconnected with a middle rail or middle member of the rail kit. The middle rail often will be supported within an inner channel or groove of the outer rail assembly and the middle rail may be positioned by sliding within the outer rail assembly between retracted and extended positions. In the extended position, the middle rails typically extend outward from the ends of the outer rail assemblies several inches to a foot or more to allow access to an attached or supported server or other computing device. In the retracted position, the middle rail has its outer end positioned within the outer rail.

To mount a server in the rack, a pair of inner or rack rails is attached to an outer surface of a server (or other computer device) chassis, and each of the inner or rack rails is coupled with or otherwise interconnected to a corresponding one of the middle members or rails. Generally, a server is mounted within the server storage rack by extending out the middle rail, aligning the ends of the both of the inner or rack rails on the server chassis with the ends of the middle rails, and, once proper alignment is achieved on both sides, pushing on the server chassis to cause the inner rails or racks to mate or couple with the middle members or rails (e.g., in a tongue-and-groove manner) as the inner rails slide within channels or grooves of the middle member or rails. Continued pushing then causes the middle member or rail to slide within the outer rail or member from the extended position to the retracted position, which allows the storage rack door to be closed.

Each of the outer rail assemblies may include a pair of nested, sliding rails (e.g., first and second sliding rails). For instance, as the distance between the front and rear vertical support members of the rack may vary from rack to rack, the sliding rails of each outer rail assembly may be adjusted to accommodate such differences in rack or cabinet sizing. Moreover, the sliding rails of the outer rail assemblies are free to move or slide relative to each other and are only restricted from moving or sliding relative to each other (e.g., in an axial direction) by way of their interconnection with the front and rear vertical support members (e.g., by way of snap features, pin/hole arrangements, screws, bolts, and the like).

SUMMARY

The relative sliding movement or "slop" between the sliding rails of the outer rail assemblies once mounted to the cabinet or rack presents numerous problems. For instance, an impact of the front of the cabinet (e.g., during shipping, while the cabinet is being rolled down a hallway) may cause the server and/or other components of the cabinet (e.g., outer, middle, inner rails) to shift or slide forward or in a direction towards the front of the cabinet. However, as the first and second sliding rails of previous outer rail assemblies do not move as a single unit (because they are free to slide relative to each other in the absence of their connection to the front and rear vertical support members of the cabinet), the interconnection between the first sliding rail and the front vertical support member of the cabinet (e.g., near a snap feature or near a pin/hole connection) may be subjected to greater stresses than the interconnection between the second sliding rail and the rear vertical support member. Additionally, increased vibration between various components of the cabinet may occur. As a result, portions of the cabinet (e.g., rail assemblies, RETMA rails) may undergo strain and/or deformation which may lead to damage of the cabinet/rack, servers and/or other computing equipment.

However, by restricting relative movement between the first and second sliding members of the outer rail assemblies (e.g., in addition to the interconnection of the first and second sliding members to the front and rear vertical support members of the cabinet), the first and second sliding members of each outer rail assembly can be made to function or otherwise move as a single unit. Allowing the first and second sliding members of each outer rail assembly to move as a single unit (e.g., the first and second sliding members are restricted from moving relative to each other even in the absence of their connection to the front and rear vertical support members of the cabinet) may distribute a more even load from the above-noted impact to both of the front and rear vertical support members (e.g., RETMA rails) as opposed to primarily only a single RETMA rail. This load distributed to each of the front and rear vertical support members may be less than the load that would otherwise be transmitted essentially to only the front vertical support member in the absence of the first and second sliding members moving as a single unit. Restricting relative movement between the first and second sliding members of the outer rail assemblies may enhance and reinforce the structural integrity of the rack and lead to fewer repairs and/or replacement of rack components and computing devices.

To this end, locking or movement restriction mechanisms are provided that are operable to selectively restrict sliding or axial movement or translation between first and second outer rail or sliding members of an outer rail assembly and thereby enhance the structural integrity of computing device cabinets and racks. Each locking mechanism can be released to allow the first and second outer rail members to adjustably slide in first and second opposite directions to accommodate different front to rear vertical member spacings of various cabinets and racks. Once the outer rail assemblies have been appropriately mounted or otherwise interconnected to the cabinet (e.g., to the front and rear vertical support members) and once the locking mechanisms on the outer rail assemblies have been appropriately engaged, a server or other computing device can be slid or otherwise inserted into the cabinet.

In one aspect, a rail assembly is provided that broadly includes a first rail member and a second rail member that slidably engages the first rail member, whereby the first and second rail members can respectively slide in first and second opposite directions. The rail assembly also includes a locking mechanism that is interconnected to at least one of the first and second rail members and that selectively controls an extent to which the first and second rail members can slide in at least one of the first and second opposite directions. It will be appreciated that additional outer rail members may also be included with the rail assemblies disclosed herein.

The locking mechanism may include a locking member that is interconnected to one of the first and second outer rail members, a plurality of receiving components on the other of the first and second outer rail members each of which may receive the locking member, and a release mechanism interconnected to the locking member that selectively positions the locking member in a first position away from the plurality of receiving components and in a second position towards the plurality of receiving components. The first and second rail members can slide in either of the first and second opposite directions when the locking member is in the first position and can slide in only one of the first and second opposite directions when the locking member is in the second position. The locking member may include any appropriate member(s) that can at least assist in selectively controlling or limiting an extent to which the first and second outer rail members can slide relative to each other and/or in at least one of first and second opposite directions.

In one variation, the locking member may include at least one pawl or a ratchet cam on one of the first and second outer rail members that can engage with a corresponding receiving component or components on the other of the first and second outer rail members. The ratchet cam may be appropriately pivotally interconnected (e.g., via a pivot pin) to the one of the first and second outer rail members. In this regard, the ratchet cam may be operable to pivot between a locked position whereby the other of the first and second outer rail members can slide or otherwise move in a single direction (e.g., in a direction such that mounting tabs or brackets on each of the first and second outer rail members move towards each other) and an unlocked position whereby the other of the first and second outer rail members can slide or otherwise move in first and second opposite directions (e.g., such that the mounting tabs move towards and/or away from each other). To aid in relative sliding movement between the first and second outer rail members, one of the first and second outer rail members may be nested within the other of the first and second outer rail members. For instance, one or more of the first and second outer rail members may include one or more curled edges to aid in the nesting arrangement. Furthermore, any appropriate bearing arrangements (e.g., ball, roller) may be utilized. In other variations, the locking member or members may include pins, bolts, snap features, or the like.

The receiving components may also be subject to a number of characterizations. In one characterization, the receiving component or features may include a series of openings, holes or slots of any appropriate shape that are operable to selectively receive the locking member or members. In another characterization, the receiving component or features may include a series of ridges and valleys (e.g., teeth) that can receive the locking members. Other combinations of locking members and receiving components are also contemplated as being within the scope of the disclosed aspects and embodiments.

In further variations, the release mechanism may include one or more various arms, levers, buttons and the like that are operable to selectively position the locking member in a first direction away from the plurality of receiving components. For instance, the release mechanism may include an arm that is operable to pivot with the locking member (e.g., pawl, ratchet cam) to move the locking member in the first direction and/or a second direction towards the plurality of receiving components. As another example, the release mechanism may include an arm that is operable to be moved in third and fourth opposite directions to selectively move the pawl into the first and/or second position. For instance, the release mechanism may be slidable in the third and fourth directions or in other directions to move the pawl or other locking member(s) into the first and/or second position.

In one embodiment, the locking mechanism may include one or more biasing members that can urge the locking member (e.g., pawl, ratchet cam, or the like) towards the plurality of receiving components (e.g., openings) and into the second position. As an example, the biasing member may include a torsion spring, compression spring, leaf spring, or the like. In this regard, the biasing member may cause the locking member to be engaged with one of the receiving components or at least the other of the first and second outer rail members unless the release mechanism is appropriately engaged. In one arrangement, the locking mechanism may function as a ratcheting device whereby the first and second outer rail members can be moved or slid towards each other (e.g., the above mentioned mounting tabs can be moved towards each other) without engagement of the release mechanism. In this situation, the locking member (e.g., ratchet cam) may drop into and pull out of successive receiving components as the first and second outer rail members are slid towards each other. However, the first and second outer rail members may be limited from being moved apart from each other because the locking member will engage with one of the receiving components to control or otherwise limit such movement.

In another embodiment, the rail assembly may include any appropriate sliding assembly such as a third rail member that is slidably interconnected to at least one of the first and second rail members. The sliding assembly may be removably interconnected to the at least one computing device and may slidably mount the at least one computing device relative to the first and second rail members. It should be appreciated that the sliding assembly may include the previously described middle and/or inner rail members or assemblies that may be appropriately interconnected to the first and second outer rail members. Such rail members or assemblies may include any appropriate sliding mechanisms such as ball bearings, roller bears, rollers and the like.

In another aspect, a storage rack for supporting a chassis of at least one computing device is provided. The storage rack broadly includes a plurality of front and rear vertical support members, and a plurality of rail assemblies for receiving at least one computing device. Each rail assembly interconnects one of the front vertical support members to one of the rear vertical support members. For instance, each rail assembly may be operable to releasably mount a computing device (e.g. server) to the storage rack such that the computing device can be both slid into the storage rack for use and/or storage and out of the storage rack for repair and/or replacement.

In this aspect, each rail assembly includes first and second outer rail members, each of the first and second outer rail members being interconnected to the other of the first and second outer rail members and slidable in first and second opposite directions relative to the other of the first and second outer rail members. As previously discussed, the outer rail members may be operable to mount each rail assembly to the vertical support members of the storage rack. For instance, each of the first and second outer rail members may include any appropriate mounting arrangement(s) (e.g., brackets, tabs, snap features) that may be operable to be appropriately interconnected to a corresponding portion of the vertical support members. In one arrangement, the first outer rail member may be removably interconnected to the front vertical support member and the second outer rail member may be removable interconnected to the rear vertical support member. Additional outer rail members may also be included. Each rail assembly also includes a sliding assembly (e.g., middle and/or inner rail assemblies) received by at least one of the first and second outer rail members that is operable to slidably mount the at least one computing device relative to the first and second outer rail members and thus the cabinet as a whole. Additionally, each rail assembly includes a locking mechanism (e.g., the above-described locking mechanism) that is associated with the first and second outer rail members. The locking mechanism is operable to selectively limit the amount by which at least one of the first and second outer rail members can slide in at least one of the first and second opposite directions.

In one arrangement, each of the first and second outer rail members may include at least one mounting tab or bracket. For instance, the mounting tab of the first outer rail member may be operable to engage one of the front vertical support members and the mounting tab of the second outer rail member may be operable to engage one of the rear vertical support members. In one variation, each of the mounting tabs of the first and second outer rail members may include at least one pin that is operable to engage an opening in the front and rear vertical support members, respectively.

BRIEF DESCRIPTION OF THE DRAWINGS

FIG. 3 is an elevation view of a locking mechanism and outer rail assembly according to another embodiment that is mounted on a storage rack along with a prior art outer rail assembly.

DETAILED DESCRIPTION

Figure 1A:
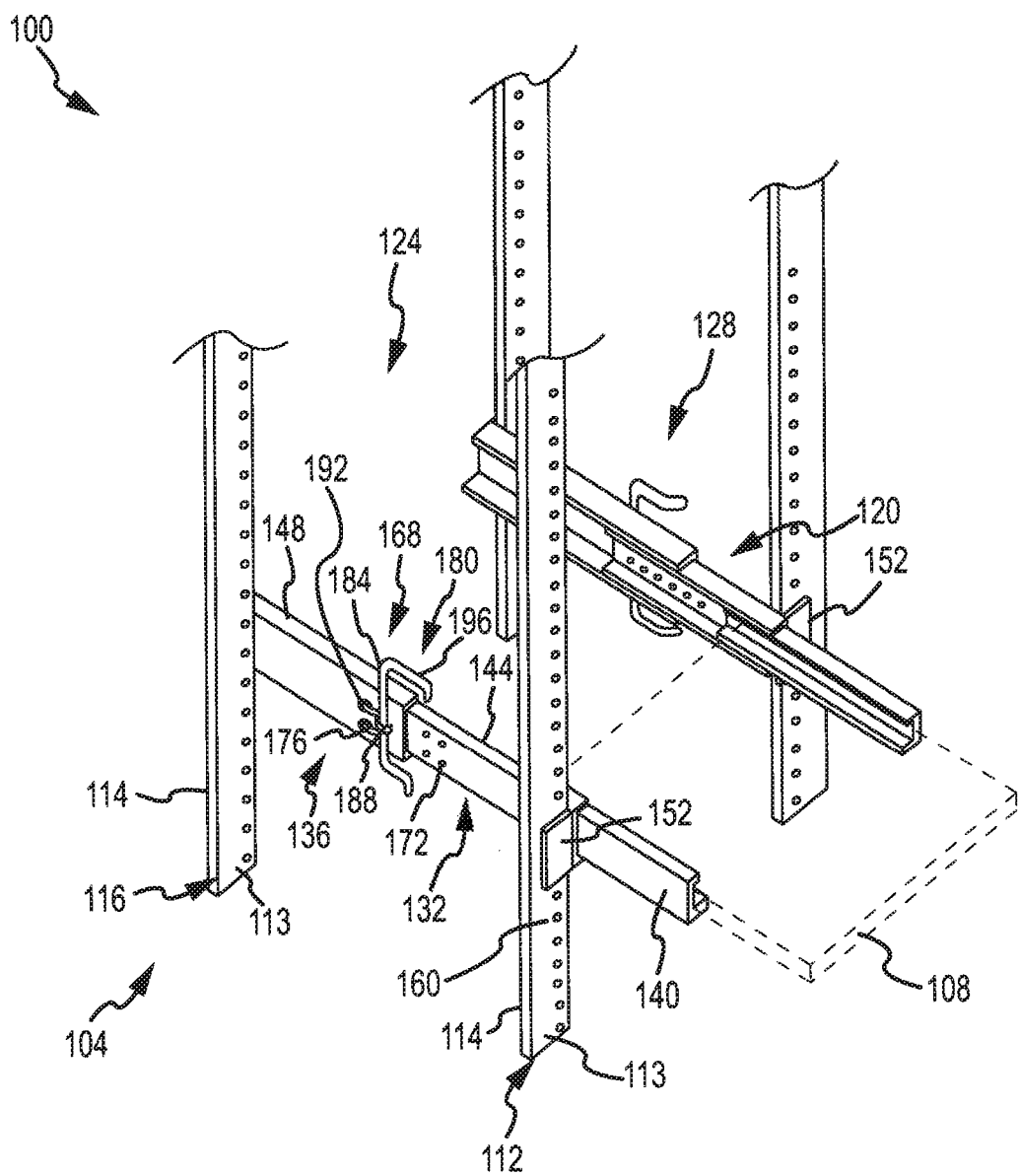
FIG. 1A is a perspective view of one embodiment of a computer or server storage rack showing rail assemblies having middle rails or members in extended positions from outer rail assemblies and a computing device (e.g., server) mounted within the middle rails.

FIG. 1A is a perspective view of one embodiment of a system 100 operable to store one or more servers or other computing devices. Broadly, the system 100 may include a computer or server storage cabinet or rack 104 that may support one or more computing devices 108 (e.g., servers). For instance, a number of computing devices 108 may be mounted on the rack 104 in a vertically stacked fashion, although other arrangements (e.g., stacked horizontally) are also envisioned. The rack 104 may include a number of vertical support members such as front and rear vertical support members 112, 116 that extend upward from a floor or other platform (not shown). Each of the front and rear vertical support members 112, 116 may include front and rear faces 113, 114 that may be operable to receive and/or interact with rack mount kits 128 as will be described more fully below.

The rack 104 may also include a front access opening 120 through which the computing devices 108 may be retracted and reinserted, and a rear access opening 124 through which necessary connections may be made to the computing devices 108 for coupling the computing devices 108 to external components or to one another for instance. Although not illustrated, side panels may extend between the front and rear access openings 120 and 124 to form an internal volume of the rack 104 in which the computing devices 108 are positioned. Additionally, access doors may be provided over the front and rear access openings 120, 124 to close the rack 104 when all of the computing devices 108 are positioned in the rack. Grills or other perforations may be included on any appropriate portion of the rack 104 to enhance air flow through the system 100. As will be appreciated, the various components of the rack 104 may be formed of metal, plastic, or the like.

One or more rack mount kits 128 may be appropriately mounted on the rack 104, each of which may be operable to receive at least one computing device 108. Each rack mount kit 128 may include a number of rail assemblies 132 (e.g., two), each of which may be appropriately mounted between front and rear vertical support members 112, 116. The rack mount kits 128 permit the computing devices 108 to be recessed or inserted into the rack 104 or withdrawn from the rack 104 for servicing while remaining mechanically supported by the rail assemblies 132 in a cantilevered manner as will be more fully described below.

For instance, each rail assembly 132 may include an outer rail assembly 136 and a middle rail assembly 140 that may be slid or translated relative to the outer rail assembly 136 to facilitate installation of components (e.g., computing devices 108) on the rail assemblies 132. Although not illustrated, an inner rail assembly of any appropriate form may be appropriately interconnected with the computing device 108 to facilitate interconnection of the computing device 108 with the middle rail assembly 140. Other rail assemblies and members may also be included with the system 100 and are encompassed within the scope of the embodiments. While the computing device 108 illustrated in FIG. 1A is shown as being shorter than each rail assembly 132 (e.g., has a height dimension less than that of the rail assembly 132), it is also envisioned that the computing device 108 may have a height dimension equal to or greater than one or more rails or portions of the rail assembly 132.

Each outer rail assembly 136 may include first and second outer rail members 144, 148 that may be operable to slide or translate relative to one another. For instance, the first and second outer rail members 144, 148 may include complimentary grooves or profiles (e.g., C-shaped) that allow the first outer rail member 144 to be nested and slide within the second outer rail member 148. Any appropriate sliding facilitation members (e.g., ball or roller bearings) may also be included in the rail assemblies 132. Allowing the first and second outer rail members 144, 148 to slide relative to each other accommodates racks 104 of various sizes as will be more fully described below.

Each of the first and second outer rail members 144, 148 may also include at least one mounting bracket or tab 152 that may be operable to at least removably mount the rail assembly 132 to a portion of the rack 104 (e.g., front and/or back face 113, 114 of the front and rear vertical support members 112, 116). For instance, each mounting tab 152 may be formed as an integral piece with the first and/or second outer rail member (e.g., such as by a series of stamping and bending operations) and may include any number of bends, protrusions and the like that may be necessary to interconnect and or mate with the front and/or back faces 113, 114 of the front and/or rear vertical support members 112, 116. In other embodiments, the mounting tabs 152 may be formed separately from the first and second outer rail members 144, 148 and may thereafter be appropriately attached (e.g., via welding) to the first and second outer rail members 144, 148.

Figure 2A:
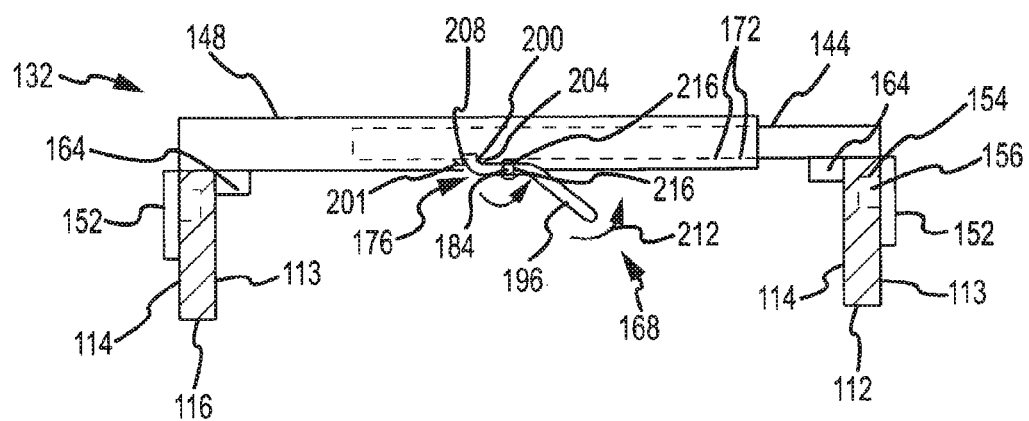
FIG. 2A is a top view of the locking mechanism and outer rail assembly of FIG. 1B.

With additional reference now to FIG. 2A, each of the mounting tabs 152 may include a number (e.g., two) of pegs or pins 156 that may be operable to be received in a series of mounting apertures 160 (shown in FIG. 1A) situated on the front and/or back faces 113, 114. Additionally, one or more snap features 164 (shown schematically in FIG. 2A) may be included with the mounting tabs 152 and/or front and/or rear vertical support members 112, 116 to aid in mounting the rail assemblies 132 to the rack 104. For instance, one of the mounting tabs 152 and/or front and/or rear vertical support members 112, 116 may include a biasing member (e.g., spring tab) and the other may include any appropriate receiving components (e.g., opening, bore, groove or the like) to receive the biasing member and removably mount the mounting tab 152 to the front and/or rear vertical support member 112, 116. Other interconnection mechanisms between the mounting tabs 152 and the rack 104 are also envisioned such as bolts and threaded openings and the like.

Figure 1B:
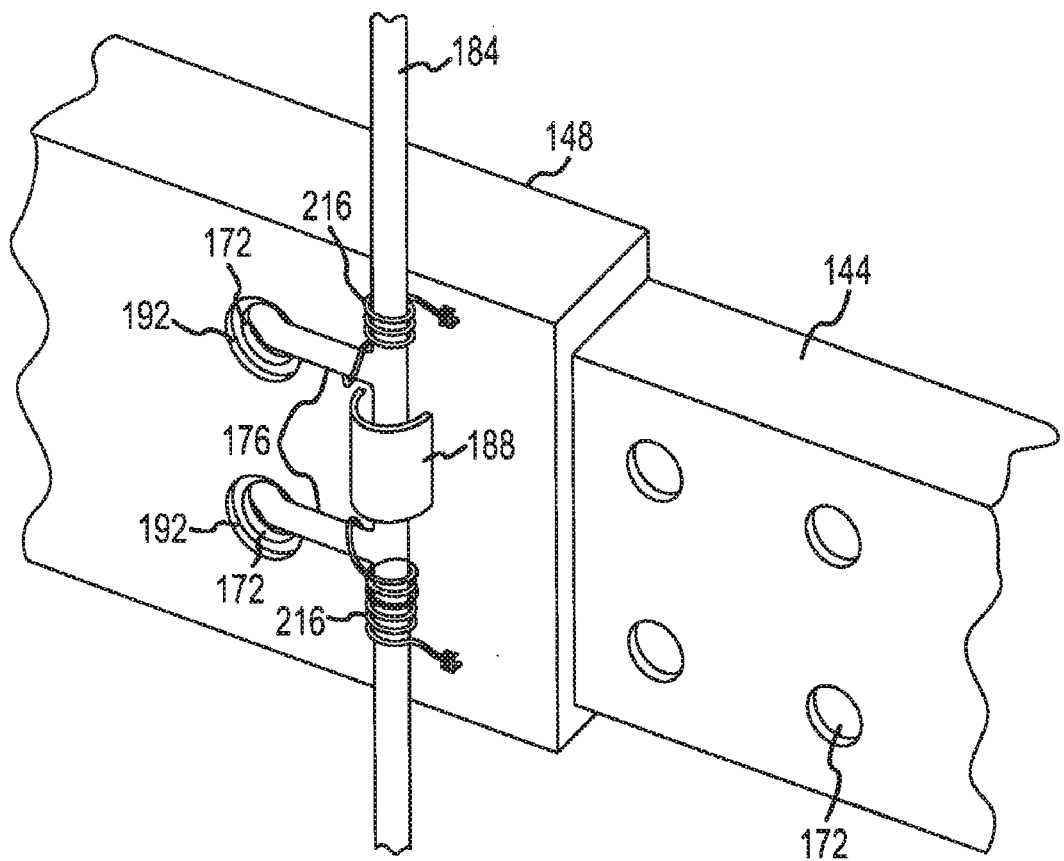
FIG. 1B is a perspective view of a locking mechanism according to one embodiment that can limit translation of first and second outer rail members of an outer rail assembly of the rack of FIG. 1A.

With reference now to FIGS. 1A, 1B and 2A, each rail assembly 132 may also include a locking mechanism 168 that may be operable to at least reduce relative movement between the first and second outer rail members 144, 148, even in the absence of the interconnection of the first and second outer rail members 144, 148 to the front and rear vertical support members 112, 116 via the mounting tabs 152 or other mounting device(s). As previously discussed, the locking mechanism 168 may serve to increase the structural integrity of the rack 104 by causing the first and second outer rail members 144, 148 to move as a single unit. As a result, a more even loading on the front and rear vertical support members 112, 116 by the mounting tabs 152 and other components (e.g., snap features 164, pins 156) may be provided in the event of an impact of the system 100 (e.g., the rack 104 running into a door or wall) which may reduce the potential for strain and/or deformation of system components (e.g., rail assemblies 132, computing devices 108, and so on).

As illustrated, the locking mechanism 168 may be in the form of a ratchet assembly, although other forms and types of locking devices and/or assemblies are also envisioned (e.g., one or more pegs being received through corresponding holes on each of the first and second outer rail members). Broadly, the locking mechanism 168 may include a number of receiving components 172 such as holes, teeth, tooth slots, ridges and valleys, etc. (see FIGS. 1A and 1B) on one of the first and/or second outer rail members 144, 148 (as illustrated, on the first outer rail member 144), at least one (e.g., two) locking member 176 such as a pawl, ratchet cam, ratchet tooth or teeth, pin, peg, etc. on the other of the first and/or second outer rail members 144, 148 (as illustrated, on the second outer rail member 148), and at least one release mechanism 180 (labeled in FIG. 1A) such as a handle, lever, etc. appropriately interconnected to the locking member 176 by way of a pin 184 to at least selectively position the locking member 176 in a first position away from the plurality of receiving components 172. Note that while a portion of the first outer rail member 144 is shown in phantom lines in FIG. 2A to illustrate that the portion may not be visible in this view, the spaces along the phantom lines also represent the receiving components 172.

The locking members 176, release mechanism 180 and pin 184 may be interconnected (e.g., rigidly) in any appropriate manner (e.g., welding, adhesives or the like) or may be integrally formed as one-piece. Moreover, these members may also be collectively interconnected or otherwise mounted to the second outer rail member 148 in any appropriate manner. For instance and with additional reference now to FIG. 1B, the pin 184 may be located through at least one loop or sleeve 188 that may be appropriately interconnected (e.g., welded) to a portion of the second outer rail member 148. In other embodiments, the pin 184 may be appropriately situated within a portion of the second outer rail 148 such that it can pivot or rotate and such that the locking members 176 can interact with the receiving components 172. As shown in FIGS. 1A and 1B, the loop 188 may allow the pin 184 to pivot or rotate about an axis that is at least generally parallel to the front and rear vertical support members 112, 116 and at least generally perpendicular to a longitudinal axis (not labeled) of the rail assembly 132. In other embodiments, the rotation axis of the pin 184 may be generally parallel to the front and rear vertical support members 112, 116 and to the longitudinal axis of the rail assembly 132. Other orientations of the pivot axis of the pin 184 are also contemplated.

Each locking member 176 may interact or engage with one of the receiving components 172 by way of an access aperture 192 located through a portion of the second outer rail member 148 (see FIG. 1B). Each access aperture 192 may be of a shape and size that allows the locking member 176 to engage at least one of the receiving components 172 and/or to rotate or otherwise be positioned away from the receiving components 172 by way of the pin 184 and release mechanism 180 (e.g., when the release mechanism is appropriately manipulated as will be described below). The release mechanism 180 may include one or more handles or arms 196 that are operable to be manipulated to move or position the locking members 176 away from the receiving features 172.

With particular reference to FIGS. 1B and 2A, the locking members 176 are illustrated as being received in the receiving components 172. As a result, at least one of the first and second outer rail members 144, 148 may be operable to slide relative to the other in a first direction such that the mounting tabs 152 of the first and second outer rail members 144, 148 can slide towards each other. However, the first and second outer rail members 144, 148 may not be operable to slide in a second direction such that the mounting tabs 152 slide away from each other. More particularly, each of the locking members 176 may be designed to have a first surface or portion 200 (e.g., a portion that is operable to contact a first edge or portion of a receiving component 172) that is sloped or otherwise angled relative to the first outer rail member 144 such that an acute angle 204 is defined between the first portion 200 and the first outer rail member 144. Thus, as the first and second outer rail members 144, 148 are being positioned towards each other (e.g., the mounting tabs 152 are positioned towards each other), the first portion 200 of each of the locking members 176 may be operable to slide out of and into each successive receiving component 172 until the first and second outer rail members 144, 148 have stopped being pushed together and the locking members 176 have settled in respective receiving components 172.

However, an attempt to slide or otherwise position the first and second outer rail members 144, 148 in a second direction away from each other while the locking members 176 are received in or otherwise engaged with the receiving components 172 may be avoided owing to an interaction between a second portion 208 of the locking members 176 and a second edge or portion of the respective receiving components 172. For instance, the second portion 208 may be sloped or otherwise angled such that an obtuse angle 201 may be formed between the second portion 208 and the first outer rail member 144. The interaction between the second portion 208 and the second edge or portion of the receiving component 172 may be operable to limit the locking members 176 from moving away from or exiting the receiving components 172 (e.g., in a first direction away from the first and second outer rail members 144, 148). As a result, the first and second outer rail members 144, 148 may be operable to move as a single unit (e.g., during an impact scenario) which may increase the structural integrity of the rail assemblies 132 and therefore the entire system 100.

With continued reference to FIG. 2A (the loop 188 has been removed for clarity), when the release mechanism 180 is manipulated (e.g., pushed) in a first direction 212, the pin 184 may be operable to pivot relative to the first and second outer rail members 144, 148 and cause retraction or positioning of the locking members 176 into a first position away from the receiving components 172 and the first and second outer rail members 144, 148. At this point, the first and second outer rail members 144, 148 may be free to slide or otherwise be positioned either towards or away from each other as the locking members 176 are not received with or engaging with the receiving components 172.

Referring back to FIG. 1B, each locking mechanism 168 (not labeled in FIG. 1B) may also include at least one biasing member 216 of any appropriate shape or material that may be operable to bias the locking members 176 into a second position towards the first and second outer rail members 144, 148 such that the locking members 176 may engage or otherwise interact with the receiving components 172 or other portions of the first and second outer rail members 144, 148. For instance, each biasing member 216 may be in the form of a torsion spring wrapped around a portion of the pin 184 that may be operable to urge the locking members 176 towards the receiving components 172. One arm (not labeled) of the torsion spring may be appropriately interconnected to and/or interact with a portion of a locking member 176 and another arm (not labeled) may be appropriately interconnected to and/or interact with a portion of the second outer rail member 148. However, other forms and arrangements of biasing members 216 are also encompassed within the embodiments disclosed herein. The biasing member 216 may ensure that once the locking members 176 are received within or otherwise engaged with the receiving components 172, the first and second outer rail members 144, 148 may be limited in the amount that they can be spread apart from each other unless the release mechanism 180 is manipulated in the first direction with a force greater than a biasing force provided by the biasing member 216 so as to withdraw the locking members 176 from the receiving components 172.

Figure 2B:
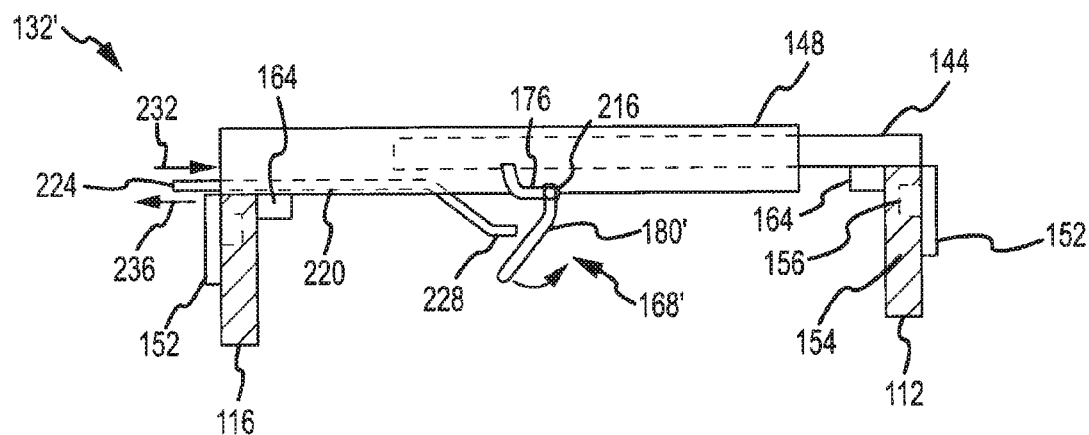
FIG. 2B is a top view of a locking mechanism and outer rail assembly according to another embodiment.

FIG. 2B presents another embodiment of a rail assembly 132' that may be used in place of the rail assembly 132 of FIGS. 1A, 1B and 2A. Corresponding components between the embodiments are identified by common reference numerals. Those corresponding components that differ in at least some respect from the embodiment of FIGS. 1A, 1B and 2A are identified by a "single prime" designation in FIG. 2B. Similar to the rail assembly 132 of previous embodiments, the one or more components of the rail assembly 132' may be of any appropriate size, shape, configuration and/or type. A difference between the rail assembly 132 of FIGS. 1 and 2A and the rail assembly 132' of FIG. 2B is the use of a pushing mechanism 220 (e.g., push bar, arm) that may be operable to allow manipulation of the locking mechanism 168' from a position remote from the locking mechanism 168'. Allowing manipulation of the locking mechanism 168' from a position remote from the locking mechanism 168' may be advantageous when direct access to the locking mechanism 168' is not available due to side panels, wiring, and the like.

In the embodiment of FIG. 2B, the locking mechanism 168' may either be in the form of the locking mechanism 168 of FIGS. 1A, 1B and 2A or else may include a release mechanism 180' that protrudes from the pin 184 at a position near a central portion of the pin 184 along a longitudinal axis thereof. In any case, the pushing mechanism 220 may be appropriately mounted relative to (e.g., within, along an outer surface of) the second outer rail member 148 such that the pushing mechanism 220 can slide in opposite directions (e.g., first and second, third and fourth, and the like) relative to the second outer rail member 148. For instance, the pushing mechanism 220 may be constructed of any appropriate material and/or shape and may include a first portion 224 for being pushed or otherwise manipulated by a user and a second portion 228 for engaging the release mechanism 180' or other portion of the locking mechanism 168'. As illustrated, the pushing mechanism 220 may be in the form of a push bar including a rod or arm having one or more sections and/or bends although other types of pushing mechanisms 220 are also encompassed within the scope of the embodiments.

In operation, a user may push the pushing mechanism 220 in a first direction 232 to engage the release mechanism 180' of the locking mechanism 168' and thereby cause the withdrawal of the locking members 176 from the receiving components 172. If a biasing member 216 is utilized in this embodiment, a user would need to push with a force greater than the biasing force provided by the biasing member 216. In any event, once the user has stopped providing such a force, the biasing member 216 may serve to urge the release mechanism 180' in a second direction which thereby withdraws the locking members 176 from the receiving components 172 and also urges the pushing member 220 in a second direction 236 such that the first portion 224 protrudes from the second outer rail member 148 as illustrated in FIG. 2B.

Turning now to FIG. 3, a side view of a storage rack 104' is presented that includes another embodiment of a rail assembly 132'' that may be used in place of the rail assembly 132 of FIGS. 1A, 1B and 2A. For comparative purposes, the storage rack 104 also includes a prior art rail assembly 300 including first and second outer rail members 144, 148 but without a locking mechanism. Corresponding components between the embodiments are identified by common reference numerals. Those corresponding components that differ in at least some respect from the embodiment of FIGS. 1A, 1B and 2A are identified by a "double prime" designation in FIG. 3.

Similar to the rail assembly 132 of previous embodiments, the one or more components of the rail assembly 132'' may be of any appropriate size, shape, configuration and/or type. Differences between the rail assembly 132 of FIGS. 1A, 1B and 2A and the rail assembly 132'' of FIG. 3 include the receiving components 172'' being in the form of a number of rows of teeth, and each of the locking members 176'' being in the form of a pawl or ratchet cam that is operable to engage with one of the rows of teeth. One or more access apertures and/or biasing members are not shown for ease of illustration and the locking mechanism 168" may be attached to the second outer rail member 148 in any appropriate manner (e.g., via loops, sleeves or the like, not shown). In this regard, the locking mechanism 168" may resemble a spring-loaded ratchet mechanism whereby the pawl or ratchet cam can snap or click over a number of the rows of teeth to allow a desired adjustment of the first and second outer rail members 144, 148.

For instance, when the release member 180 is manipulated towards the first and second outer rail members 144, 148 (e.g., via a biasing member 216, via a user pushing the release member 180) such that the locking members 176" (e.g., ratchet cam) engage the receiving components (e.g., teeth), the first and second outer rail members 144, 148 may be only free to slide towards one another such that the locking members 176" ratchet along the receiving components 172". Thereafter, when a user has obtained a desired spacing of the first and second outer rail members 144, 148 and the respective mounting tabs 152 (not labeled in FIG. 3) have been clamped about the front and rear vertical support members 112, 116, the first and second outer rail members 144, 148 may be limited from sliding towards each other (owing to the front and rear vertical support members 112, 116) and away from each other (owing to the spring-loaded ratchet mechanism). To allow the first and second outer rail members 144, 148 to slide away from each other, the release member 180 may be appropriately manipulated (e.g., pushed or pulled) in a direction away from the first and second outer rail members 144, 148 to remove or withdraw the locking members 176" from the receiving components 172", and the mounting tabs 152 may be appropriately released from the front and rear vertical support members 112, 116, if necessary.

In use and when the storage rack 104 is subjected to a loading force (e.g., an impact S adjacent the front vertical support member 112 during shipping), the prior art rail assembly 300 may transmit a load S' to primarily only a portion of the rear face 114 of the front vertical support member 112 via, for instance, the first outer rail member 144 through a snap feature 304 or other structure interconnecting the first outer rail member 144 to the front vertical support member 112. As can be seen in FIG. 3, the load S' is applied to a relatively concentrated portion of the front vertical support member 112 (near snap feature 304). As this load S' may be greater than any load transmitted to the rear vertical support member 116 (e.g., at or adjacent a rear face 114), the interconnection between the first outer rail member 144 and the front vertical support member 112 may be subjected to greater stresses than the interconnection between the second outer rail member 148 and the rear vertical support member 116 and increased vibration between various components of the storage rack 104 may occur. As a result, portions of the cabinet (e.g., rail assemblies, RETMA rails) may undergo strain and/or deformation which may lead to damage of servers and/or other computing equipment.

In contrast and also when the storage rack 104 is subjected to the impact S, the first and second outer rail members 144, 148 of the rail assembly 132" (in addition to those of earlier described embodiments) may function as a single unit and allow the rail assembly 132" to transmit at least substantially equal loads S" to each of the front and rear vertical support members 112, 116, each load S" being less than the load S'. Particularly, because the load S" that is distributed to the rear face 114 of the front vertical support member 112 via the snap feature 164 may be less than the load S', the snap feature 164 may undergo less strain than that experienced by the snap feature 304. Furthermore and as can be seen in FIG. 3, the load S" applied to the rear vertical support member 116 is distributed over a larger portion of the rear face 114 of the rear vertical support member 116 than the concentrated portion of the front vertical support member 112 that the load S' is applied to. Thus, the rail assemblies disclosed herein distribute impact loads more evenly throughout a storage rack and reduce the potential for damage to system components. Storage rack and computing device integrity is thereby increased.

Figure 4:
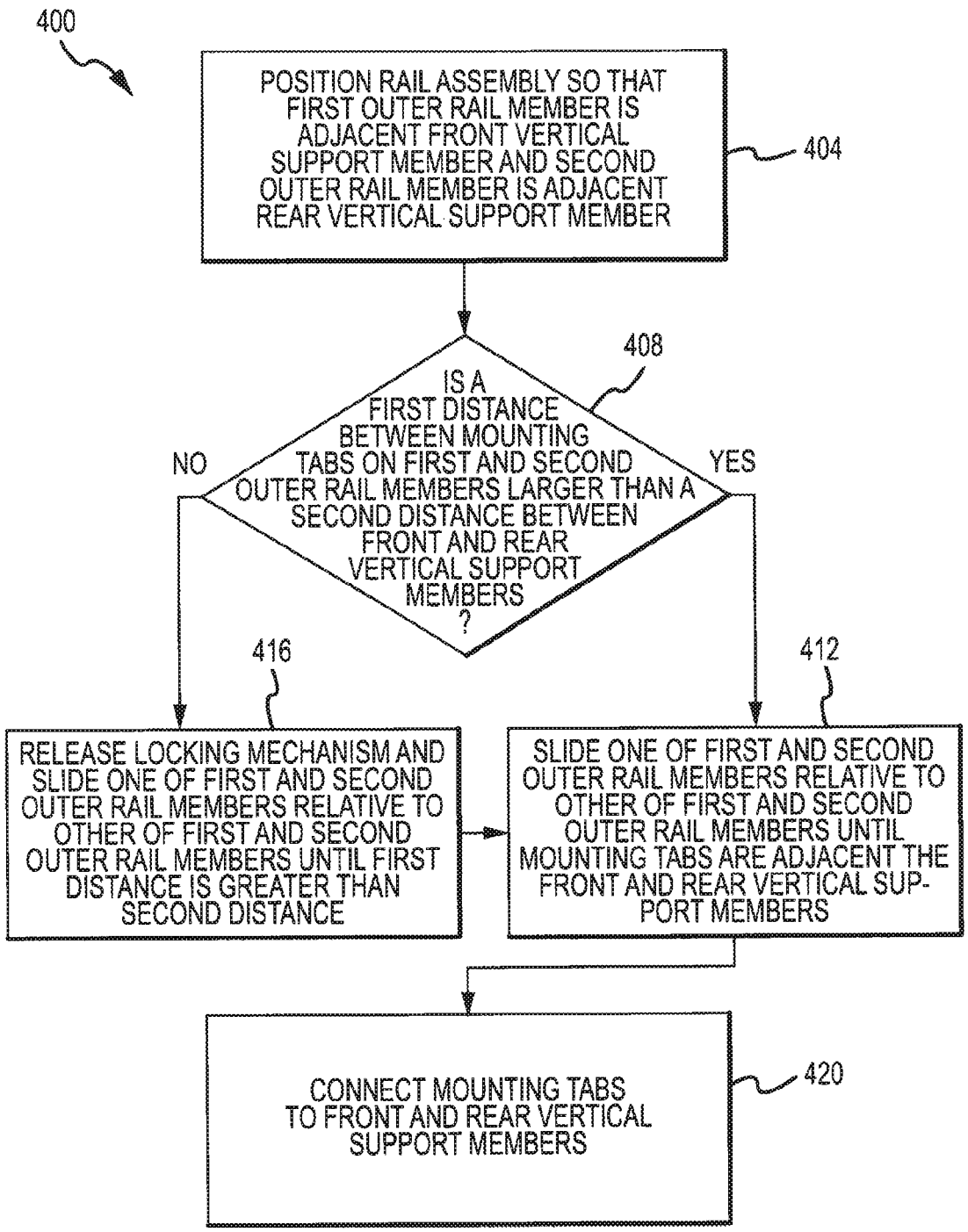
FIG. 4 is a flow diagram illustrating one method of use of the rail assembly of any of FIG. 1A, 1B, 2A, 2B or 3.

FIG. 4 is a flowchart of a method 400 of using a rail assembly of any of the embodiments described herein. As will be appreciated, the method 400 advantageously allows an operator to install the same rail assembly on a number of different sized storage racks or cabinets and then limit relative movement between the first and second outer rail members (e.g. using a locking mechanism) to reduce slop and vibration between the first and second outer rail members, and ultimately reduce deformation, strain and/or vibration to components of the racks and/or computing devices. One step 404 of the method may be to position a rail assembly 132, 132', 132" such that the first outer rail member 144 is adjacent a front vertical support member 112 and the second outer rail member 148 is adjacent a second vertical support member 116 of a storage rack 104. As previously discussed, each of the first and second outer rail members 144, 148 may include at least one mounting tab 152 each of which may be operable to mount or interconnect the first and second outer rail members 144, 148 to the front and rear vertical support members 112, 116. Another step 408 may be to assess whether a first distance between the mounting tabs 152 of the first and second outer rail members 144, 148 is larger than a second distance between the front and rear vertical support members 112, 116. For instance, the second distance may be between a front surface 113 of the front vertical support member 112 and a back surface 114 of the rear vertical support member 116.

If the answer in the assessing of step 408 is yes, then the method may include step 412 whereby one or both of the first and second outer rail members 144, 148 is slid or otherwise translated towards the other of the first and second outer rail members 144, 148 until mounting tabs 152 are adjacent the front and rear vertical support members (e.g., the mounting tab 152 of the first outer rail member 112 is in contact with the front surface 113 of the front vertical support member 112 and the mounting tab 152 of the second outer rail member 148 is in contact with the rear surface 114 of the rear vertical support member 116). Step 412 may include ratcheting a pawl or ratchet cam of a locking mechanism along a number of teeth to obtain a desired adjustment of the first and second outer rail members 144, 148 relative to each other. Thereafter, the mounting tabs 152 may be appropriately interconnected to the front and rear vertical support members 112, 116 (e.g., by snap features, pin or bolt and hole arrangements) in step 420.

If the answer in the assessing of step 408 is no, then the method may include step 416 whereby the locking mechanism 168, 168', 168" is released and the first and second outer rail members 144, 148 are slid or otherwise translated apart until the first distance is greater than or about equal to the second distance. As previously discussed, the first and second outer rail members 144, 148 may be slid apart from each other when the release member 180, 180' is manipulated thereby withdrawing the locking members 176, 176" from the receiving components 172, 172'. Thereafter, the locking members 176, 176" may be reengaged (e.g., the locking members 176, 176" reengage the receiving components 172, 172') and the first and second outer rail members 144, 148 may be slid towards one another until the mounting tabs 152 engage the front and rear vertical support members 112, 116. The mounting tabs 152 may then be appropriately interconnected to the front and rear vertical support members 112, 116 in step 420.

The systems, apparatuses and methods disclosed herein advantageously allow the rail assemblies of rack mount kits to accommodate or otherwise be used with storage racks of various sizes while allowing each rail assembly to move as a single unit, e.g., during impact scenarios, to reduce the compromise of system components (e.g., rail assemblies, computing devices). The above described embodiments including the preferred embodiment and the best mode of the invention known to the inventor at the time of filing are given by illustrative examples only.

It will be readily appreciated that many deviations may be made from the specific embodiments disclosed in the specification without departing from the spirit and scope of the invention. For example, the locking mechanisms described herein are not limited to ratchet-type mechanisms. In one variation, one or more of the locking mechanisms may include a series of holes through both of the first and second outer rail members and a pin that may be slid through at least one hole in each of the first and second outer rail members to limit or reduce relative sliding or translation between the first and second outer rail members. In another arrangement, one of the first and second outer rail members may include a series of holes and the other of the first and second outer rail members may include a spring-loaded button or tab that may be selectively received in one or more of the holes. Once received in one of the holes, a user may depress or otherwise manipulate the button out of the hole, translate the first and second outer rail members to a desired position, and allow the button to be received in another of the holes to prevent from or otherwise reduce the likelihood of the first and second outer rail members sliding relative to each other.

We claim:

1. A server rack-mount assembly for use in mounting a server in a storage cabinet with first and second vertical supports, comprising:
    a first rail with a sidewall attached at a first end to the first vertical support;
    a second rail with a sidewall received at a first end by the first rail sidewall for sliding engagement with the first rail, wherein a second end of the second rail is attached to the second vertical support such that the first and second rail extend between the first and second vertical supports and wherein the second end of the second rail is adapted to receive the server; and
    a reinforcement mechanism supported on the first rail proximate to the second end of the first rail, wherein the reinforcement mechanism is operable to selectively engage the second rail to connect the second end of the first rail to the second rail, wherein the reinforcement mechanism comprises a pawl element pivotally attached to the first rail and a plurality of ratchet teeth on the sidewall of the second rail proximate to the first end of the second rail and wherein one of the first and second rails is slidable relative to the other of the first and second rails when the pawl element is engaged with one of the ratchet teeth.

2. The assembly of claim 1, wherein the pawl element includes a pair of pawls that extend through the sidewall of first rail to engage the ratchet teeth to resist moving the second rail relative to the first rail in a direction that positions the first end of the second rail nearer to the second end of the first rail.

3. The assembly of claim 1, wherein the reinforcement mechanism comprises a locking mechanism pivotally mounted on the sidewall of the first rail and wherein the sidewalls of the first and second rails each comprise a plurality of openings for receiving a locking member extending outward from the locking mechanism to lock the second rail in position relative to the first rail and wherein the openings of the sidewalls are aligned when the rails are positioned in a plurality of mounting positions.

4. The assembly of claim 1, wherein the reinforcement mechanism includes a locking mechanism configured to lock the second rail in position relative to the first rail, whereby the first and second rail function as a single rigid body.

5. The assembly of claim 4, wherein the reinforcement mechanism comprises a resilient member urging the locking mechanism toward engagement with the second rail.

6. The assembly of claim 4, wherein the reinforcement mechanism further comprises a release mechanism for selectively moving the locking mechanism from an engaged position in which the locking mechanism engages the second rail to a release position in which the locking mechanism is spaced apart from the second rail to allow the second rail to slide within the first rail.

7. A storage rack for supporting a chassis of at least one computing device, comprising:
    front and rear vertical support members;
    rail assemblies for receiving at least one computing device, each rail assembly interconnecting one of the front vertical support members to one of the rear vertical support members, wherein each rail assembly comprises:
        a first outer rail member that is removably interconnected to one of the front vertical support members and a second outer rail member that is removably interconnected to one of the rear vertical support members, wherein each of the first and second outer rail members is interconnected to the other of the first and second outer rail members and slidable in first and second opposite directions relative to the other of the first and second outer rail members, wherein a mountin tab on the first outer rail member engages one of the front vertical support members and a mounting tab on the second outer rail member engages one of the rear vertical support members, wherein each of the mountin tabs includes at least one peg that is received within an opening in one of the front and rear vertical sussort members respectively, and wherein the at least one peg of the mounting tab on the first outer rail member generally faces the at least one peg on the mounting tab on the second outer rail member;
        a sliding assembly that is slidably received by at least one of the first and second outer rail members, wherein the sliding assembly is removably interconnected to the at least one computing device and slidably mounts the at least one computing device relative to the first and second outer rail members; and
        a locking mechanism interconnected to at least one of the first and second outer rail members that selectively limits at least one of the first and second outer rail members from sliding in at least one of the first and second opposite directions.

8. The storage rack of claim 7, wherein the locking mechanism comprises a locking member interconnected to one of the first and second outer rail members that is selectively received within at least one receiving component on the other of the first and second outer rail members.

9. The storage rack of claim 8, wherein the locking member is pivotally supported on the one of the first and second outer rail members.

10. The storage rack of claim 7, wherein the second outer rail member is nested within the first outer rail member.

11. The storage rack of claim 7, wherein the sliding assembly comprises at least one mounting rail that is slidably nested within one of the first and second outer rail members and removably interconnected to the at least one computing device.

12. A rail assembly that is operable to receive at least one computing device, comprising:
   a first rail member;
   a second rail member that slidably engages the first rail member, wherein the first and second rail members can respectively slide in first and second opposite directions; and
   a locking mechanism interconnected to at least one of the first and second rail members, the locking mechanism selectively controlling an extent to which the first and second rail members can slide in at least one of the first and second opposite directions, the locking mechanism comprising:
      a locking member that is interconnected to one of the first and second outer rail members;
      a plurality of receiving components on the other of the first and second outer rail members, wherein each of the plurality of receiving components can receive the locking member; and
      a release mechanism interconnected to the locking member that selectively positions the locking member in a first position away from the plurality of receiving components and in a second position towards the plurality of receiving components, whereby the first and second rail members can slide in either of the first and second opposite directions when the locking member is in the first position and can slide in only one of the first and second opposite directions when the locking member is in the second position such that the locking member moves from engagement with a first of the receiving components into engagememt with at least a second of the receiving components.

13. The rail assembly of claim 12, wherein the locking mechanism further comprises a biasing member that is operable to urge the locking member into the second position towards the plurality of receiving components.

14. The rail assembly of claim 13, wherein the biasing member comprises a torsion spring.

15. The rail assembly of claim 12, wherein the locking member comprises a ratchet cam that is pivotally interconnected to the one of the first and second outer members.

16. The rail assembly of claim 12, wherein the plurality of receiving components comprises at least one selected from the group of openings, teeth and slots.

17. The rail assembly of claim 12, further comprising:
   a third rail member that is slidably interconnected to at least one of the first and second rail members, wherein the third rail member is removably interconnected to the at least one computing device and slidably mounts the at least one computing device relative to the first and second rail members.

18. The rail assembly of claim 12, wherein sliding the first and second rail members in the one of the first and second opposite directions when the locking member is in the second position causes the first and second rail members to slide towards one another.

19. The rail assembly of claim 18, wherein each of the first and second rail members comprises a mounting tab for engaging a front or rear vertical support member, and wherein sliding the first and second rail members in the one of the first and second opposite directions when the locking member is in the second position causes the mounting tabs of the first and second rail members to move towards each other.

20. The assembly of claim 1 wherein the first and second rails are slidable in only one of first and second opposite directions when the pawl element is engaged with one of the ratchet teeth.

* * * * *

UNITED STATES PATENT AND TRADEMARK OFFICE
CERTIFICATE OF CORRECTION

PATENT NO. : 8,118,178 B2  Page 1 of 1
APPLICATION NO. : 12/609977
DATED : February 21, 2012
INVENTOR(S) : Olesiewicz et al.

It is certified that error appears in the above-identified patent and that said Letters Patent is hereby corrected as shown below:

Column 13, line 56, after "rail", insert --,--.
Column 14, lines 36-37, delete "mountin" and insert therefor --mounting--.
Column 14, line 41, delete "mountin" and insert therefor --mounting--.
Column 14, line 43, delete "sussort" and insert therefor --support--.
Column 14, line 43, after "members", insert --,--.
Column 15, line 36, delete "engagememt" and insert therefor --engagement--.

Signed and Sealed this
Third Day of April, 2012

David J. Kappos
*Director of the United States Patent and Trademark Office*